US010883824B2

(12) United States Patent
Hur et al.

(10) Patent No.: US 10,883,824 B2
(45) Date of Patent: Jan. 5, 2021

(54) PATTERN LIGHT EMITTING DEVICE CAPABLE OF HAVING PLURALITY OF DIFFERENT PATTERN LIGHT SOURCES INSTALLED THEREON AND INSPECTION DEVICE

(71) Applicant: KOH YOUNG TECHNOLOGY INC., Seoul (KR)

(72) Inventors: Jung Hur, Bucheon-si (KR); Woo Jae Choi, Yongin-si (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 0 days.

(21) Appl. No.: 16/343,532

(22) PCT Filed: Oct. 23, 2017

(86) PCT No.: PCT/KR2017/011706
§ 371 (c)(1),
(2) Date: Apr. 19, 2019

(87) PCT Pub. No.: WO2018/074907
PCT Pub. Date: Apr. 26, 2018

(65) Prior Publication Data
US 2019/0265025 A1 Aug. 29, 2019

(30) Foreign Application Priority Data

Oct. 21, 2016 (KR) .................. 10-2016-0137910

(51) Int. Cl.
*G01B 11/25* (2006.01)
*G01N 21/95* (2006.01)
(Continued)

(52) U.S. Cl.
CPC ........ *G01B 11/254* (2013.01); *G01B 11/2513* (2013.01); *G01N 21/8806* (2013.01);
(Continued)

(58) Field of Classification Search
CPC .... G01B 11/254; G01B 1/2513; G02B 30/00; G02B 27/0927; G02B 27/20;
(Continued)

(56) References Cited

U.S. PATENT DOCUMENTS 8,670,117 B2  3/2014 Hong et al.
2008/0278729 A1* 11/2008 Kim .................. G01B 11/254
356/450
(Continued)

FOREIGN PATENT DOCUMENTS

CN  101726261  6/2010
CN  102565078  7/2012
(Continued)

OTHER PUBLICATIONS

Extended European search report corresponding to European Patent Application No. 17862392.2, dated Sep. 30, 2019.
(Continued)

*Primary Examiner* — Isiaka O Akanbi
(74) *Attorney, Agent, or Firm* — Kile Park Reed & Houtteman PLLC

(57) ABSTRACT

Disclosed are a pattern light irradiating device and an inspection apparatus using the same. The pattern light irradiating device includes first and second pattern light sources installed on a frame having a plurality of through-holes. Each of the through-holes is formed along a single optical axis. The first pattern light source is configured to irradiate first pattern light having a fixed pitch. The second pattern light source is configured to irradiate second pattern light having a variable pitch.

7 Claims, 4 Drawing Sheets

(51) Int. Cl.
*G01N 21/88* (2006.01)
*H01L 21/66* (2006.01)
*H04N 5/372* (2011.01)
*G02B 30/00* (2020.01)
*G02B 27/09* (2006.01)
*G02B 27/20* (2006.01)

(52) U.S. Cl.
CPC ......... *G01N 21/9501* (2013.01); *G02B 30/00* (2020.01); *H01L 22/12* (2013.01); *H04N 5/372* (2013.01); *G02B 27/0927* (2013.01); *G02B 27/20* (2013.01)

(58) Field of Classification Search
CPC ........... G01N 21/8806; G01N 21/9501; H01L 22/12; H04N 5/372
USPC ............................................ 356/237.2–237.6
See application file for complete search history.

(56) References Cited

U.S. PATENT DOCUMENTS

| 2010/0091302 | A1* | 4/2010 | Kim | G01B 11/24 356/603 |
| 2012/0127463 | A1* | 5/2012 | Hong | G01N 21/956 356/237.5 |
| 2014/0009601 | A1* | 1/2014 | Cho | G01N 21/9501 348/126 |
| 2014/0218969 | A1 | 8/2014 | Kjaer et al. | |

FOREIGN PATENT DOCUMENTS

| CN | 103597283 | 2/2014 |
| EP | 2 175 233 | 4/2010 |
| JP | 7-306162 | 11/1995 |
| KR | 10-1998-072996 | 11/1998 |
| KR | 10-2005-0031328 | 4/2005 |
| KR | 10-2008-0099008 | 11/2008 |
| KR | 10-1639227 | 7/2016 |

OTHER PUBLICATIONS

Written Opinion for International Application No. PCT/KR2017/011706, with English translation, dated Jan. 17, 2018.
International Search Report for International Application No. PCT/KR2017/011706, dated Jan. 17, 2018.
Korean Office Action with English translation for Korean Application No. 10-2016-0137910, dated Oct. 10, 2017.
Korean Final Office Action with English translation for Korean Application No. 10-2016-0137910, dated Mar. 20, 2018.
Chinese Office Action, with English translation, corresponding to Chinese Application No. or Publication No. 201780063339.8, dated Sep. 11, 2020.

* cited by examiner

PATTERN LIGHT EMITTING DEVICE CAPABLE OF HAVING PLURALITY OF DIFFERENT PATTERN LIGHT SOURCES INSTALLED THEREON AND INSPECTION DEVICE

TECHNICAL FIELD

The present disclosure relates to a pattern light irradiating device for an inspection apparatus generating and irradiating pattern light from a plurality of light sources.

BACKGROUND

In order to inspect an object such as a circuit board on which components are mounted, it may be possible to use a method for acquiring a three-dimensional image of an inspection target object and determining whether or not the inspection target object is defective from the three-dimensional image. As a method for acquiring a three-dimensional image of the inspection target object, there has been used a technique for irradiating light having a pattern to the inspection target object while changing the phase of the pattern and generating the three-dimensional image of the inspection target object from a shape in which the irradiated pattern is distorted on a surface of the inspection target object. One method for forming such pattern light is to install a pattern grating for forming a pattern in front of a light source and to form a pattern in light irradiated from the light source while passing through the pattern grating. The pattern grating is finely moved by an electromechanical moving device such as a piezoelectric transducer (PZT) or the like, whereby a phase of the pattern formed in the light passing through the pattern grating is changed.

Another method for forming pattern light is to generate and irradiate pattern light using a device including a Digital Micro-mirror Device (DMD), i.e., a micro-mirror structure. This method may be implemented using an optical device such as a Digital Light Processing (DLP) projector or the like. Furthermore, according to this method, the optical device irradiates an image including a predetermined pattern to the inspection target object, which makes it possible to obtain an effect that the light on which the pattern is formed is irradiated to the inspection target object. Therefore, according to this method, by sequentially irradiating images of a plurality of patterns having different phases to an inspection target object, it is possible to obtain an effect of irradiating phase-changing pattern light to the inspection target object. In addition, by merely changing the pattern image irradiated by the optical device, it is possible to irradiate pattern light having different pattern pitches to the inspection target object.

In the method of irradiating the pattern light to the inspection target object and acquiring the three-dimensional image of the object as described above, a resolution of the three-dimensional image is determined according to the pitch of the pattern light. Since the pattern grating used for forming the pattern light is fabricated through micro-fabrication, the pitch (or grating pitch) of the pattern grating may be very finely adjusted. Therefore, when the pattern light is formed by using the pattern grating, the pattern pitch of the pattern light may be made very small and the pattern light may be irradiated to the inspection target object. It is therefore possible to acquire a precise three-dimensional image of the inspection target object. However, since the pitch of the pattern of the pattern grating is fixed, it is difficult to change the resolution of the three-dimensional image according to the inspection target object. That is, a standard of the pattern grating and the piezoelectric element used in a pattern light source of an inspection apparatus are preliminarily determined in accordance with requirements of an inspection target object at the time of manufacturing the inspection apparatus, and then the pattern grating and the piezoelectric element are attached to the inspection apparatus. Therefore, it is not easy to change the pattern grating or the piezoelectric element of the inspection apparatus to another standard.

Furthermore, when a height difference between two measurement points on the inspection target object exceeds an integer multiple of the pattern pitch of the pattern light, a $2n$ ambiguity problem arises. A method for increasing the pattern pitch of the pattern light may be used in order to make it possible to measure a larger height difference on the inspection target object. However, in this method, if the pitch of the pattern grating is increased to a certain level or more in order to increase the pattern pitch of the pattern light, there is a problem that a moving device cannot move the pattern grating enough to change the phase of the pattern light.

Therefore, when the step difference of a surface flexion of the inspection target object is large and heights of protrusions on the surface are variable, even if the pattern light formed by using a pattern grating having a fixed pattern pitch is irradiated to the inspection target object, it is difficult to acquire a precise three-dimensional image of an object.

Meanwhile, when pattern light is formed by using a DLP projector using a DMD chip, pattern pitch or phase of the pattern light may be easily changed by changing the pattern image used by the DLP projector. However, the DLP projector has a problem in that the manufacturing cost thereof is high and a resolution of the pattern light irradiated to the inspection target object is set lower than that of a method of forming pattern light using a pattern grating. This problem arises because the minimum size of pixels of the pattern image formed by the DLP projector is larger than the minimum pattern pitch of the pattern grating.

Due to the characteristics of the pattern light irradiation methods used in the conventional three-dimensional shape inspection apparatus described above, it is necessary to manufacture a device irradiating pattern light having a resolution in a limited range according to the flexural characteristics of an inspection target object or the user's request. This has a problem that the manufacturing cost of the inspection apparatus increases. Accordingly, there is a need to provide a single inspection apparatus effectively inspecting inspection target objects having various three-dimensional shapes.

SUMMARY

A pattern light irradiating device according to one embodiment of the present disclosure may include: a frame having a plurality of through-holes each formed along a single optical axis; a first pattern light source fixedly installed on the frame and configured to irradiate first pattern light having a fixed pitch through a first set of the through-holes; and a second pattern light source fixedly installed on the frame and configured to irradiate second pattern light having a variable pitch through a second set of the through-holes.

In the pattern light irradiating device according to one embodiment of the present disclosure, the pitch of the first pattern light may be set to be smaller than the pitch of the second pattern light.

In the pattern light irradiating device according to one embodiment of the present disclosure, the frame may be formed by combining a first sub-frame and a second sub-frame, the first set of the plurality of through-holes may be formed in the first sub-frame and the second sub-frame, the second set of the plurality of through-holes may be formed in the second sub-frame, the first pattern light source may be fixedly installed on the first sub-frame, and the second pattern light source may be fixedly installed on the second sub-frame.

The pattern light irradiating device according to one embodiment of the present disclosure may further include: a plurality of reflectors installed at lower ends of the plurality of through-holes, wherein the plurality of reflectors may be configured to reflect the first pattern light or the second pattern light irradiated through the plurality of through-holes such that the first pattern light or the second pattern light is irradiated toward an inspection target object.

The pattern light irradiating device according to one embodiment of the present disclosure may further include: at least one camera fixedly installed on the frame and configured to capture an image of an inspection target object to which the first pattern light or the second pattern light is irradiated.

An inspection apparatus according to one embodiment of the present disclosure may include: a pattern light irradiating device configured to irradiate pattern light toward an inspection target object; a transferring part configured to transfer the inspection target object; and a controller configured to control the pattern light irradiating device and the transferring part, wherein the pattern light irradiating device may include a frame having a plurality of through-holes each formed along a single optical axis, a first pattern light source fixedly installed on the frame and configured to irradiate first pattern light having a fixed pitch through a first set of the through-holes, and a second pattern light source fixedly installed on the frame and configured to irradiate second pattern light having a variable pitch through a second set of the through-holes, and the controller may control the transferring part to transfer the inspection target object to an inspection position below the pattern light irradiating device and may control the pattern light irradiating device to irradiate the pattern light toward the inspection target object.

In the inspection apparatus according to one embodiment of the present disclosure, the controller may control the pattern light irradiating device such that the first pattern light source and the second pattern light source irradiate pattern light at different points of time.

In the inspection apparatus according to one embodiment of the present disclosure, the pitch of the first pattern light may be set to be smaller than the pitch of the second pattern light.

In the inspection apparatus according to one embodiment of the present disclosure, the frame may be formed by combining a first sub-frame and a second sub-frame, the first set of the plurality of through-holes may be formed in the first sub-frame and the second sub-frame, the second set of the plurality of through-holes may be formed in the second sub-frame, the first pattern light source may be fixedly installed on the first sub-frame, and the second pattern light source may be fixedly installed on the second sub-frame.

DETAILED DESCRIPTION

Figure 1:
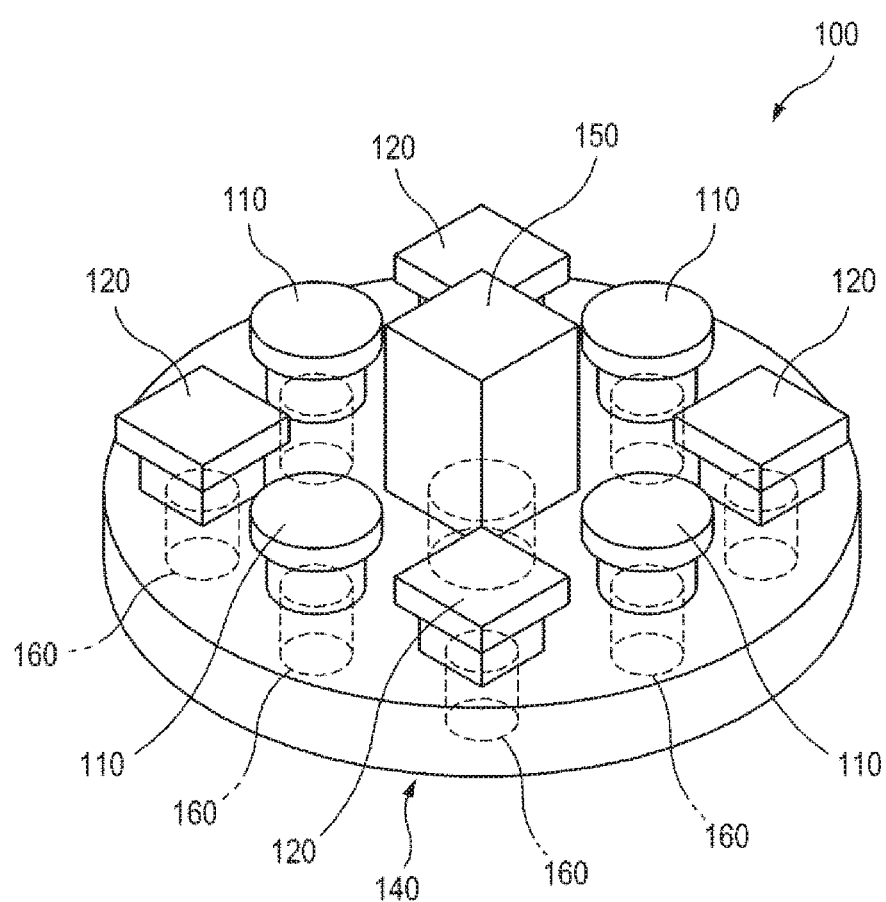
FIG. 1 illustrates a pattern light irradiating device according to one embodiment of the present disclosure.

Hereinafter, embodiments of the present disclosure will be described with reference to the accompanying drawings. However, in the following description, when there is a possibility that the gist of the present disclosure may be unnecessarily blurred, the detailed description of widely known functions and configurations will be omitted.

The term "unit" used in these embodiments means a software component or hardware component, such as a field-programmable gate array (FPGA) and an application specific integrated circuit (ASIC). However, a "unit" is not limited to software and hardware, it may be configured to be an addressable storage medium or may be configured to run on one or more processors. For example, a "unit" may include components, such as software components, object-oriented software components, class components, and task components, as well as processors, functions, attributes, procedures, subroutines, segments of program codes, drivers, firmware, micro-codes, circuits, data, databases, data structures, tables, arrays, and variables. Functions provided in components and "unit" may be combined into a smaller number of components and "units" or further subdivided into additional components and "units."

All technical or scientific terms used herein have meanings that are generally understood by a person having ordinary knowledge in the art to which the present disclosure pertains, unless otherwise specified. The terms used herein are only selected for more clear illustration of the present disclosure, and are not intended to limit the scope of claims in accordance with the present disclosure.

A singular expression can include meanings of plurality, unless otherwise mentioned, and the same is applicable to a singular expression stated in the claims.

The terms "first", "second", etc. used herein are used to identify a plurality of components from one another, and are not intended to limit the order or importance of the relevant components.

The expressions "include", "provided with", "have" and the like used herein should be understood as open-ended terms connoting the possibility of inclusion of other embodiments, unless otherwise mentioned in a phrase or sentence including the expressions.

The expression "based on" used herein is used to describe one or more factors that influence a decision, an action of judgment or an operation described in a phrase or sentence including the relevant expression, and this expression does not exclude additional factors influencing the decision, the action of judgment or the operation.

When a certain component is described as "coupled to" or "connected to" another component, this should be understood as having the meaning that the certain component may be coupled or connected directly to the other component or that the certain component may be coupled or connected to the other component via a new intervening component.

As used herein, the term "pattern light" means light including a pattern having a predetermined period, which is irradiated to measure a three-dimensional shape of an inspection target object. In each of the pattern light sources of the pattern light irradiating devices according to the following embodiments, it will be described that so-called sinusoidal pattern light whose stripe pattern exhibits sinusoidal brightness is irradiated as pattern light having a stripe pattern. However, the pattern light according to the present disclosure is not limited to the sinusoidal pattern light, but may be various kinds of pattern light having a pattern in which the change in brightness is repeated in a predetermined period, including an on-off type pattern light in which a bright portion and a dark portion are repeatedly displayed and triangular wave pattern light in which the change in brightness is in a triangular waveform.

The pattern light irradiating device used in various embodiments of the present invention described below includes a pattern light source (hereinafter referred to as "grating pattern light source") for forming pattern light by allowing the light emitted from the light source to pass through a pattern grating, and a pattern light source (hereinafter referred to as "reflection pattern light source") for irradiating pattern light by reflecting the light emitted from a DLP type projector, i.e., a light source, by a DMD chip including an array of micro-mirrors to form a pattern image. The grating pattern light source and the reflection pattern light source are merely terms introduced for convenience of explanation and should not be limited to the dictionary meaning of these terms in interpreting the functions or operations of the pattern light sources.

The pattern light irradiating device according to the present disclosure may include at least one grating pattern light source and at least one reflection pattern light source. Since the pattern pitch of the pattern light irradiated by the grating pattern light source may be made comparatively small as compared with the pattern light irradiated by the reflection pattern light source, the pattern light irradiating device of the present disclosure may irradiate the pattern light having a small pattern pitch and the pattern light having a large pattern pitch on the same inspection target object. That is, the substrate inspection apparatus provided with the pattern light irradiating device of the present disclosure may acquire a three-dimensional image of a fine component of an inspection target object by irradiating pattern light having a fine pitch using a grating pattern light source. Furthermore, the substrate inspection apparatus provided with the pattern light irradiating device of the present disclosure may acquire a three-dimensional image of a high-height component of the same inspection target object by irradiating pattern light having a large pattern pitch using the reflection pattern light source. By irradiating pattern light having various pattern pitches to an inspection target object and acquiring a three-dimensional image of the inspection target object, it is possible to effectively inspect the inspection target object such as a substrate or the like including components having various heights. That is, according to the present disclosure, a single pattern light irradiating device can irradiate various types of pattern light. Thus, it is possible to effectively acquire a three-dimensional image of an inspection target object such as a substrate or the like including components having various heights by using a single inspection apparatus. Accordingly, it is possible to acquire a precise image of an inspection target object and to increase a defect inspection speed.

FIG. 1 illustrates a pattern light irradiating device according to one embodiment of the present disclosure. As illustrated, the pattern light irradiating device 100 may include a grating pattern light source 110 and a reflection pattern light source 120, which are alternately arranged in a substantially circular manner on a single frame 140. In addition, a camera 180 for capturing an image of an inspection target object may be disposed at the center of the frame 140. As illustrated in FIG. 1, the frame 140 may have a shape of a circular plate having through-holes formed therein. However, the present disclosure is not limited to such a shape. The frame 140 may have an appropriate shape depending on factors such as the external shape or form factor of the pattern light irradiating device to be manufactured or the inspection apparatus provided with the manufactured pattern light irradiating device.

In FIG. 1, a plurality of grating pattern light sources 110 and a plurality of reflection pattern light sources 120 are illustrated as being disposed on the frame 140. However, for example, at least one grating pattern light source 110 and at least one reflection pattern light source 120 may be disposed on the frame 140. According to one embodiment, the number of the grating pattern light sources or the reflection pattern light sources disposed on the frame 140 may be four as illustrated in FIG. 1. However, the number and arrangement pattern of the grating pattern light sources or the reflection pattern light sources arranged on the frame 140 according to the present disclosure and the shape of the frame 140 may be changed in conformity with various requirements including the accuracy of the three-dimensional image to be acquired by the pattern light irradiating device 100, the imaging time for acquiring the three-dimensional image, the size and external shape of the inspection apparatus, and the like.

The grating pattern light source 110 forms pattern light by allowing light from a light source to pass through a pattern grating and irradiates the pattern light toward the inspection target object. As described above, the pattern light irradiated by the grating pattern light source 110 may be one of pattern lights having various patterns in periodic shapes, including on-off type pattern light, triangular wave type pattern light, sinusoidal pattern light, and the like. According to one embodiment, the grating pattern light source 110 may form and irradiate pattern light by allowing light from a light source to pass a pattern grating having a fixed fine pitch. In this case, the pattern pitch of the pattern light irradiated by the grating pattern light source 110 is fixed, and the size of the pattern pitch may be set to be very small. As described above, the grating pattern light source 110 having a small pattern pitch of the pattern light may be used for acquiring a three-dimensional image of a substrate including fine components having small heights.

In the case where a plurality of grating pattern light sources 110 are arranged on the frame 140 as illustrated in FIG. 1, each of the grating pattern light sources 110 may include a pattern grating having a different pitch and may irradiate pattern light having a different pattern pitch to the inspection target object. If images acquired by irradiating pattern light having different pattern pitches to the inspection target object through the use of the plurality of grating pattern light sources 110 are combined with each other, a precise three-dimensional image of the inspection target object including components having relatively large heights may be acquired. That is, in this case, as compared with a case where the pattern light having a single pattern pitch is irradiated to the inspection target object, a precise three-dimensional image of an inspection target object including components having larger heights may be acquired while preventing the problem of $2x$ ambiguity.

On the other hand, the reflection pattern light source 120 may irradiate a pattern image to an inspection target object by reflecting a light emitted from a light source 400 on an element, for example, a DMD chip, having an array of micro-mirrors. In this regard, the pattern pitch may be adjusted by adjusting each micro-mirror arranged on the DMD chip. The reflection pattern light source 120 may irradiate pattern light having a larger pattern pitch as compared with the grating pattern light source 110. Furthermore, the reflection pattern light source 120 may freely change the pattern pitch of the pattern light as compared with the grating pattern light source 110 that irradiates pattern light having a fixed pattern pitch. Accordingly, when using only the grating pattern light sources 110, there is a limitation in acquiring precise three-dimensional images of large-height components arranged on an inspection target object such as a substrate or the like. However, when using the reflection pattern light source 120, more precise three-dimensional images of components having large heights may be acquired by irradiating pattern light having a relatively large pattern pitch. In addition, the reflection pattern light source 120 irradiates the pattern light while adjusting the pattern pitch of the pattern, such that a precise three-dimensional image may be acquired even for an inspection target object including components having various heights. Moreover, just like the grating pattern light source 110, each of the reflection pattern light sources 120 may adjust the pattern pitches of the irradiated pattern light to be different from each other. If the pattern pitch of the pattern light is adjusted as described above, as compared with a case of irradiating pattern light having a single pattern pitch, a precise three-dimensional image of an inspection target object including components having larger heights may be acquired.

As illustrated in FIG. 1, a plurality of through-holes 160 may be formed in the frame 140. The through-holes 160 may be formed through the frame 140 at a plurality of locations where at least one grating pattern light source 110 and at least one reflection pattern light source 120 are installed in the frame 140. Particularly, the through-holes 160 may be formed so that the penetration direction of each of the through-holes 160 in the frame 140 conforms to the optical axis of the pattern light irradiated from at least one grating pattern light source 110 or at least one reflection pattern light source 120. The plurality of through-holes 160 may be configured such that the pattern lights irradiated by the plurality of pattern light sources 110 or 120 have different optical axes. That is, the through-holes 160 may be formed in the frame 140 so that each of the pattern light sources 110 or 120 installed on the frame 140 corresponding to the through-holes 160 may irradiate the pattern light along a single optical axis thereof.

Figure 2:
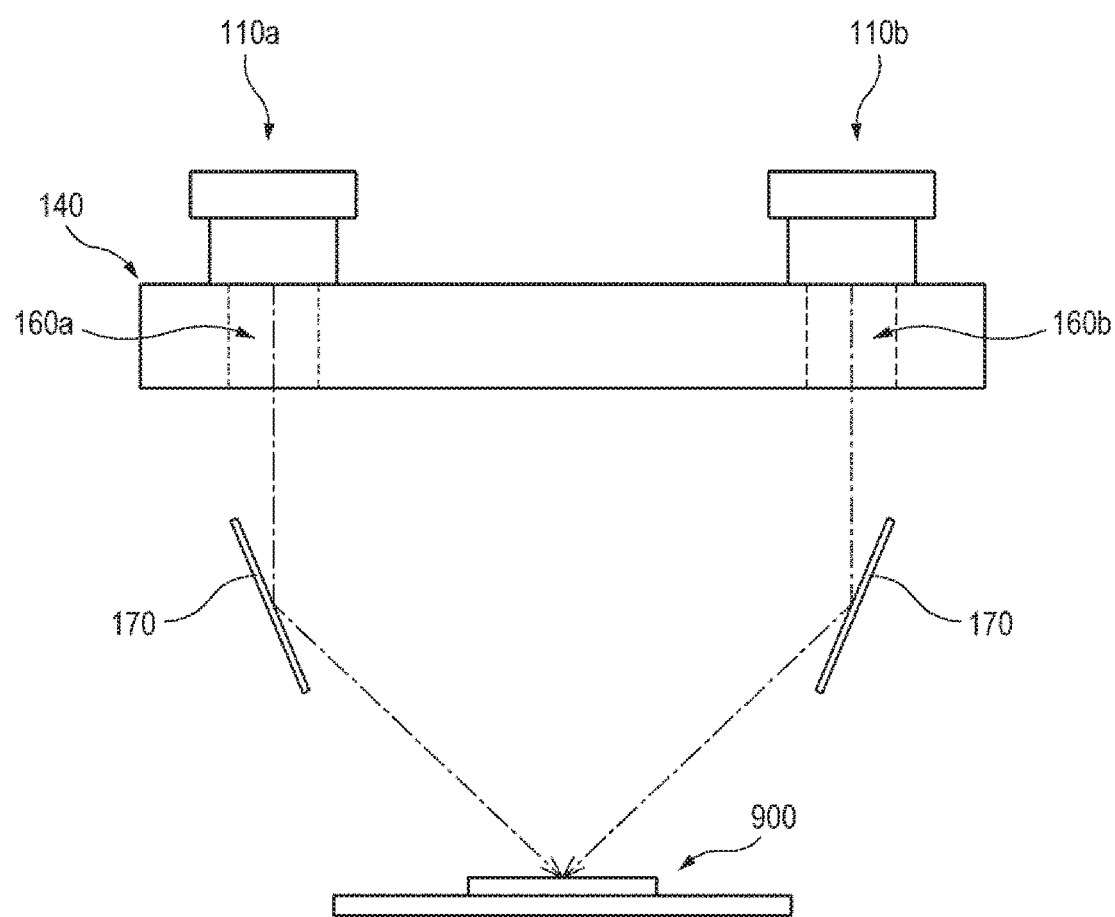
FIG. 2 illustrates through-holes formed in a frame of the pattern light irradiating device according to one embodiment of the present disclosure.

FIG. 2 illustrates a side surface of the pattern light irradiating device in which the through-holes 160a and 160b are formed in the frame 140. For the sake of convenience of explanation, FIG. 2 illustrates a state in which only two grating pattern light sources 110a and 110b are installed on the frame 140 and only two through-holes 160a and 160b corresponding to the grating pattern light sources 110a and 110b are formed below the grating pattern light sources 110a and 110b. The pattern light emitted from each of the grating pattern light sources 110a and 110b may pass through each of the through-holes 160a and 160b and may reach an inspection target object 900 by reflecting on a light path control element 170. A reflector may be used as the light path control element 170. Those skilled in the art will appreciate that, in a manner similar to that described above, other grating pattern light sources or reflection pattern light sources, through-holes corresponding thereto and light path control elements corresponding thereto may be additionally formed in the frame 140 illustrated in FIG. 2. That is, the pattern light emitted from each of the other grating pattern light sources or reflection pattern light sources additionally installed on the frame 140 may reach the same inspection target object 900 via the through-holes formed in the frame corresponding to the other pattern light sources and the light path control elements.

Figure 3:
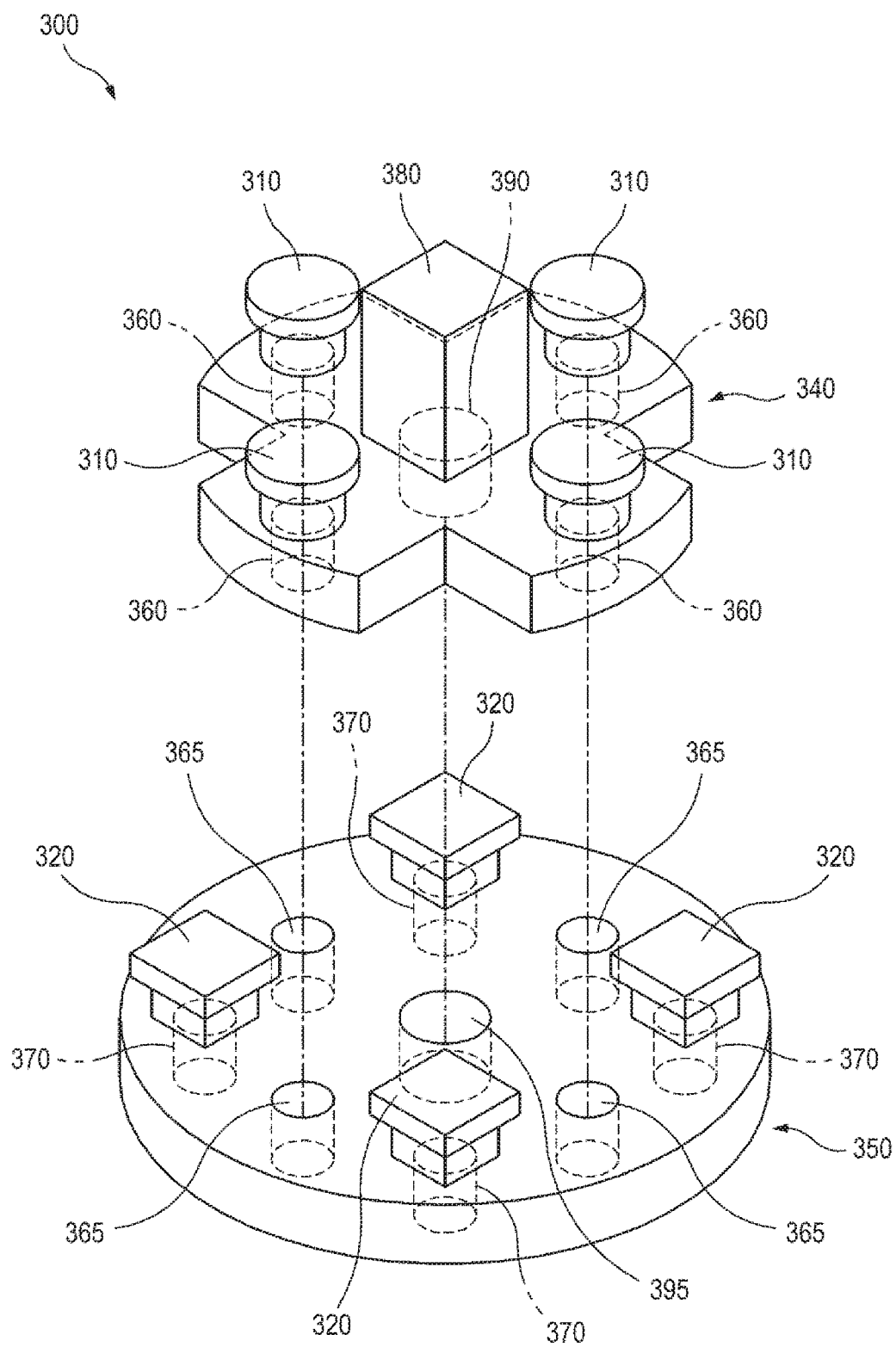
FIG. 3 illustrates a pattern light irradiating device according to another embodiment of the present disclosure.

FIG. 3 illustrates a pattern light irradiating device according to another embodiment of the present disclosure. As illustrated, the pattern light irradiating device 300 is manufactured by assembling two sub-frames 340 and 350. For example, at least one grating pattern light source 310 may be disposed in the upper sub-frame 340 and at least one reflection pattern light source 320 may be disposed in the lower sub-frame 350. A camera 380 for capturing an inspection target object may be disposed in the upper sub-frame 340. Each of the sub-frames 340 and 350 illustrated in FIG. 3 has a circular plate shape. However, just like the frame 140, the sub-frames 340 and 350 may have other shapes in conformity with the shape or form factor of the pattern light irradiating device or the inspection apparatus. Furthermore, as illustrated in FIG. 3, the upper sub-frame 340 may have cutout regions for providing spaces in which the reflection pattern light sources 320 disposed on the lower sub-frame 350 are located when the upper sub-frame 340 is coupled with the lower sub-frame 350.

A plurality of through-holes 360 for passing the pattern light emitted from the grating pattern light sources 310 may be formed in the upper sub-frame 340. Furthermore, in the upper sub-frame 340, a through-hole 390 may be formed so that the camera 380 may capture an image of the inspection target object. Just like the through-holes 160 formed in the frame 140 illustrated in FIG. 1, the through-holes 360 of the upper sub-frame 340 may be formed so that the penetration direction of each of the through-holes 360 in the upper sub-frame 340 conforms to the optical axis of the pattern light emitted from at least one grating pattern light source 110. The plurality of through-holes 360 may be configured so that the pattern light irradiated by each of the pattern light sources 310 has a different optical axis. That is, the through-holes 360 may be formed in the upper sub-frame 340 so that each of the grating pattern light sources 310 installed on the upper sub-frame 340 corresponding to the through-holes 360 can irradiate pattern light along a single optical axis thereof.

In the lower sub-frame 350, there may be formed a plurality of through-holes 365 through which the pattern light irradiated from the grating pattern light sources 310 through the through-holes 360 passes and a plurality of through-holes 370 through which the pattern light emitted from at least one reflection pattern light source 320 passes. In addition, in the lower sub-frame 350, there may be formed a through-hole 395 at a position corresponding to the through-hole 390 of the upper sub-frame 340 so that the camera 380 may capture the image of the inspection target object. Just like the through-holes 360 formed in the upper sub-frame 340, the through-holes 365 of the lower sub-frame 350 may be formed at a position of the lower sub-frame 350 corresponding to the through-holes 360 of the upper sub-frame 340 so that each of the grating pattern light sources 310 may irradiate pattern light along a single optical axis thereof. In addition, the through-holes 370 of the lower sub-frame 350 may be formed in the lower sub-frame 370 so that the pattern light emitted from each of the reflection pattern light sources 320 may be irradiated along a single optical axis.

Unlike the pattern light irradiating device 100 illustrated in FIG. 1 in which the grating pattern light sources 110 and the reflection pattern light sources 120 are disposed in the single frame 140, the pattern light irradiating device 300 illustrated in FIG. 3 has a structure in which the grating pattern light sources 310 and the reflection pattern light sources 320 are separately arranged in the two sub-frames 340 and 350. In such a structure, since only a small number of pattern light sources may be arranged on one sub-frame, the size of each sub-frame may be reduced. For example, when the sub-frame is circular, the diameter of the sub-frame may be reduced. If the size of the sub-frame may be reduced in this manner, the overall size of the pattern light irradiating device constituted by combining the sub-frames may be reduced.

Therefore, an effect of reducing the size of the inspection apparatus including the pattern light irradiating device may be obtained.

Furthermore, as compared with the embodiment illustrated in FIG. 1, in the embodiment illustrated in FIG. 3, the form similar to the frame 140 illustrated in FIG. 1 may be easily implemented by separating or excluding the upper sub-frame 340 from the two sub-frames 340 and 350. If it is difficult to reduce the size of the sub-frames, it is also possible to reduce the size of the inspection apparatus by manufacturing the pattern light irradiating device by separating or excluding the upper sub-frame 340 as described above and consequently reducing the height of the pattern light irradiating device.

Furthermore, according to the embodiments of the present disclosure as described above, by mounting one combination of pattern light sources on the frame in which the upper sub-frame 340 and the lower sub-frame 350 are combined or by mounting another combination of pattern light sources only on the lower sub-frame 350 while excluding the upper sub-frame 340, it is possible for a manufacturer to flexibly manufacture a pattern light irradiating device including pattern light sources having different configurations and a substrate inspection apparatus using the pattern light irradiating device according to various requests of customers.

Figure 4:
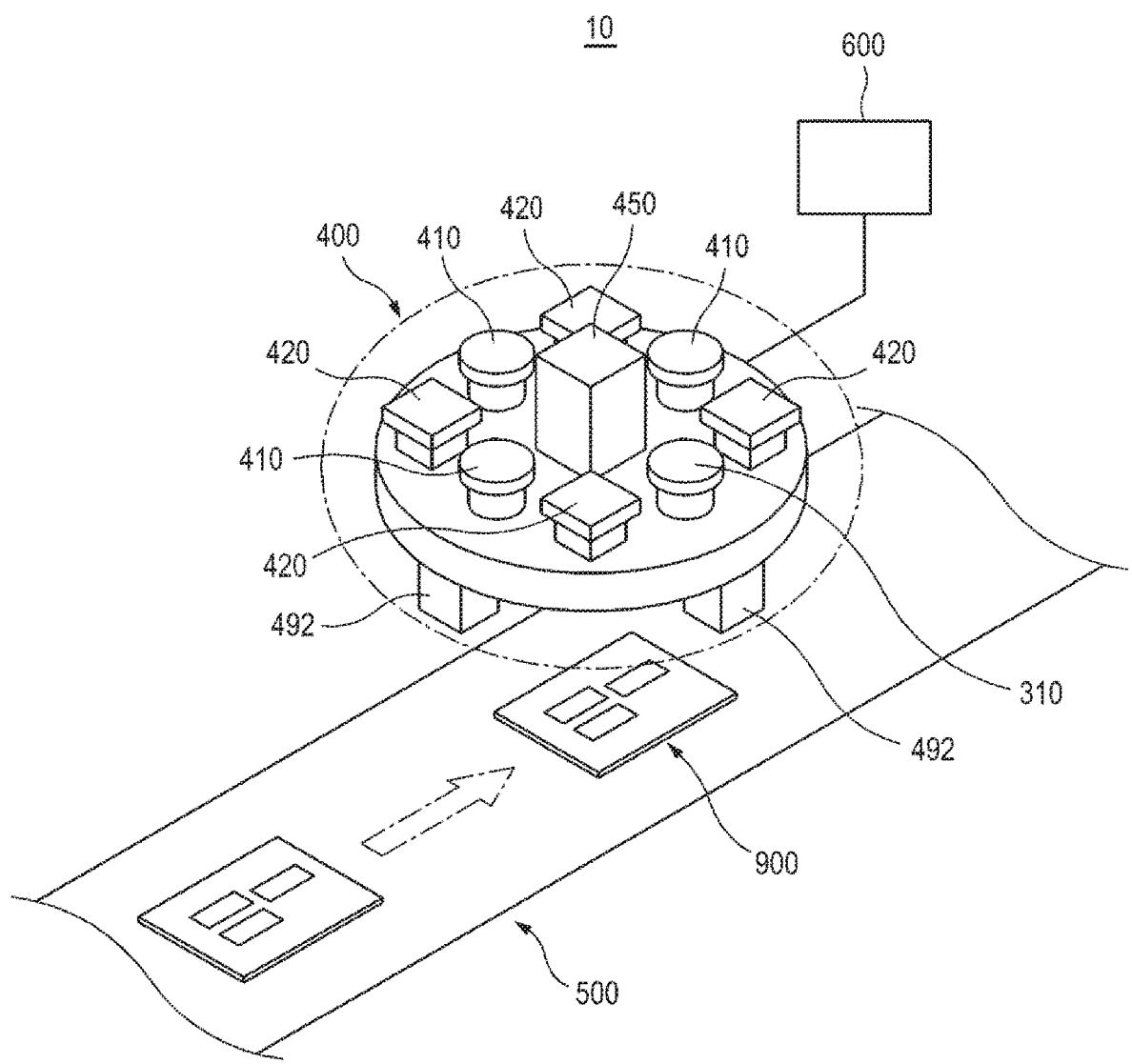
FIG. 4 illustrates a substrate inspection apparatus using the pattern light irradiating device according to one embodiment of the present disclosure and an operation thereof.

FIG. 4 illustrates a substrate inspection apparatus 10 utilizing the pattern light irradiating device according to one embodiment of the present disclosure. The substrate inspection apparatus 10 may include a pattern light irradiating device 400, a transferring part 500 and a controller 600.

The pattern light irradiating device 400 may have a structure similar to that of the pattern light irradiating device 100 illustrated in FIG. 1. In addition, the pattern light irradiating device 400 may further include one or more side cameras 492 for capturing an image of an inspection target object 900. Each of the side cameras 492 may capture a two-dimensional image of the inspection target object 900 or may further capture an image of the inspection target object 900 at an oblique angle different from that of the camera 480 in order to enhance the quality of a three-dimensional image.

The transferring part 500 may transfer the inspection target object 900, for example, a printed circuit board mounted with components, to an inspection point below the camera 480 of the pattern light irradiating device 400. Furthermore, if the pattern light irradiating device 400 completes the acquisition of the three-dimensional image of the inspection target object, the transferring part 500 may transfer the inspection target object to another point for subsequent processing.

The controller 600 controls the overall operation of the substrate inspection apparatus. The controller 600 controls the transferring part 500 to transfer the inspection target object to an inspection point below the camera 480 of the pattern light irradiating device 400 or another point. When the inspection target object is moved to the inspection point by the transferring part 500, the controller 600 controls the pattern light irradiating device 400 to irradiate pattern light to the inspection target object. In one embodiment, the controller 600 may control the grating pattern light source 410 of the pattern light irradiating device 400 to initially irradiate pattern light having a small pattern pitch while changing the phase thereof and may control the camera 480 to capture an image of the inspection target object. After the image capturing process is completed, the controller 600 may control the reflection pattern light source 420 to irradiate pattern light having a large pattern pitch while changing the phase thereof and may cause the camera 480 to capture an image of the inspection target object. The controller 600 may receive the captured images from the camera 480 and may process the captured images to generate a three-dimensional image of the inspection target object 900. In addition, the controller 600 may control the side cameras 492 to capture additional images of the inspection target object 900 and may utilize the captured images to generate a three-dimensional image.

According to various embodiments of the present disclosure, it is possible to obtain a three-dimensional image of a component using only one pattern light irradiating device without requiring additional equipment or an additional image capturing operation with respect to an inspection target object having an flexural shape with different heights.

According to various embodiments of the present disclosure, even when a component is inspected using an inspection apparatus provided with a single pattern light irradiating device, it is possible to acquire a precise three-dimensional image of an inspection target object having a large step difference or a large flexion on a surface thereof, while maintaining a high resolution in a three-dimensional image of a component.

According to various embodiments of the present disclosure, it is possible to capture and inspect an inspection target object such as a substrate or the like including components having different heights using only a single pattern light irradiating device, whereby a manufacturing cost reduction effect can be obtained by simplifying an inspection process.

According to various embodiments of the present disclosure, by installing different types of pattern light sources on a frame constituting a pattern light irradiating device, it is possible to flexibly manufacture pattern light irradiating devices having various functions and configurations and substrate inspection apparatuses using these pattern light irradiating devices.

While this disclosure has been described and illustrated through preferred embodiments, those skilled in the art will appreciate that various modifications and changes can be made without departing from the scope of the claims.

What is claimed is:

1. A pattern light irradiating device, comprising:
   a first sub-frame having a plurality of first through holes, each of which is formed along a single optical axis;
   a second sub-frame having a plurality of second through holes, which correspond to the plurality of first through holes, respectively, and a plurality of third through holes, each of which is formed along a single optical axis;
   a first pattern light source fixedly installed on the first sub-frame and configured to form first pattern light having a first pitch by allowing light to pass through a pattern grating having fixed pattern pitch and to irradiate the first pattern light having a fixed pitch toward an inspection target object, through the plurality of first through holes and the plurality of second through holes; and a second pattern light source fixedly installed on the second sub-frame and configured to form second pattern light having a second pitch by reflecting a light by a DMD (Digital Micro-mirror device) chip including an array of micro mirrors and to irradiate the second pattern light toward the inspection target object, through the plurality of third through holes, wherein the first pitch is fixed and the second pitch is adjusted by adjusting the array of micro mirrors included in the DMD chip, and the first sub-frame and the second sub-frame are configured to be assembled with each other.

2. The pattern light irradiating device of claim 1, wherein the first pitch of the first pattern light is set to be smaller than the second pitch of the second pattern light.

3. The pattern light irradiating device of claim 1, further comprising:

a plurality of reflectors installed at lower ends of the plurality of second through holes and the plurality of third through holes, wherein the plurality of reflectors are configured to reflect the first pattern light or the second pattern light irradiated through the plurality of second through holes and the plurality of third through holes such that the first pattern light or the second pattern light is irradiated toward the inspection target object.

4. The pattern light irradiating device of claim 1, further comprising:

at least one camera fixedly installed on the first sub-frame and configured to capture an image of the inspection target object to which the first pattern light or the second pattern light is irradiated.

5. An inspection apparatus, comprising:

a pattern light irradiating device configured to irradiate pattern light toward an inspection target object;

a transferring part configured to transfer the inspection target object; and a controller configured to control the pattern light irradiating device and the transferring part, wherein the pattern light irradiating device includes:

a first sub-frame having a plurality of first through holes, each of which is formed along a single optical axis, a second sub-frame having a plurality of second through holes, which correspond to the plurality of first through holes, respectively, and a plurality of third through holes, each of which is formed along a single optical axis, a first pattern light source fixedly installed on the first sub-frame and configured to form first pattern light having a first pitch by allowing light to pass through a pattern grating having a fixed pattern pitch and to irradiate the first pattern light having a fixed pitch toward the inspection target object, through the plurality of first through holes and the plurality of second through holes, and a second pattern light source fixedly installed on the second sub-frame and configured to form second pattern light having a second pitch by reflecting a light by a DMD (Digital Micro-mirror Device) chip including an array of micro mirrors and to irradiate the second pattern light toward the inspection target object, through the plurality of third through holes, wherein the first pitch is fixed and the second pitch is adjusted by adjusting the array of micro mirrors included in the DMD chip, the first sub-frame and the second sub-frame are configured to be assembled with each other, and the controller controls the transferring part to transfer the inspection target object to an inspection position below the pattern light irradiating device and controls the pattern light irradiating device to irradiate the pattern light toward the inspection target object.

6. The inspection apparatus of claim 5, wherein the controller controls the pattern light irradiating device such that the first pattern light source and the second pattern light source irradiate pattern light at different points of time.

7. The inspection apparatus of claim 5, wherein the first pitch of the first pattern light is set to be smaller than the second pitch of the second pattern light.

* * * * *